(12) United States Patent
Sato (10) Patent No.: US 6,400,226 B2
(45) Date of Patent: Jun. 4, 2002

(54) DISTRIBUTED AMPLIFIER WITH IMPROVED FLATNESS OF FREQUENCY CHARACTERISTIC

(75) Inventor: Masaru Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/725,451

(22) Filed: Nov. 30, 2000

(30) Foreign Application Priority Data

Dec. 2, 1999 (JP) ............................................. 11-343184

(51) Int. Cl.[7] ................................................. H03F 3/60
(52) U.S. Cl. ......................... 330/286; 330/295; 330/302
(58) Field of Search ................................. 330/286, 295, 330/302, 54

(56) References Cited

U.S. PATENT DOCUMENTS 4,788,511 A * 11/1988 Schindler .................... 330/277
6,049,250 A * 4/2000 Kintis et al. ................... 330/54
6,201,445 B1 * 3/2001 Morimoto et al. ........... 330/295

* cited by examiner

Primary Examiner—Robert Pascal
Assistant Examiner—Henry Choe
(74) Attorney, Agent, or Firm—Armstrong, Westerman & Hattori, LLP (57) ABSTRACT

FETs 31 to 34 for amplification are connected between an input transmission line 10 and an output transmission line 20. A terminating circuit 29 having a capacitor 292 and a terminating resistor 291 connected in series is connected to an end of the output transmission line 20. To improve a flatness of the gain over a low frequency band, a series-connected circuit having a capacitor 71 and a resistor 61 between the gate of each FET and ground, wherein the design parameter of this circuit is determined so that the impedance thereof is lower in the low frequency band but higher in a high frequency band than the input impedance of each FET.

10 Claims, 8 Drawing Sheets

DISTRIBUTED AMPLIFIER WITH IMPROVED FLATNESS OF FREQUENCY CHARACTERISTIC

BACKGROUND OF THE INVENTION

1. Field of the Invention

The present invention relates generally to a distributed amplifier, more particularly, to a distributed amplifier as a monolithic microwave integrated circuit (MMIC).

2. Description of the Related Art

The distributed amplifier has been employed at a stage before electric-to-photo conversion or after photoelectric conversion since it has wideband characteristics.

Figure 7:
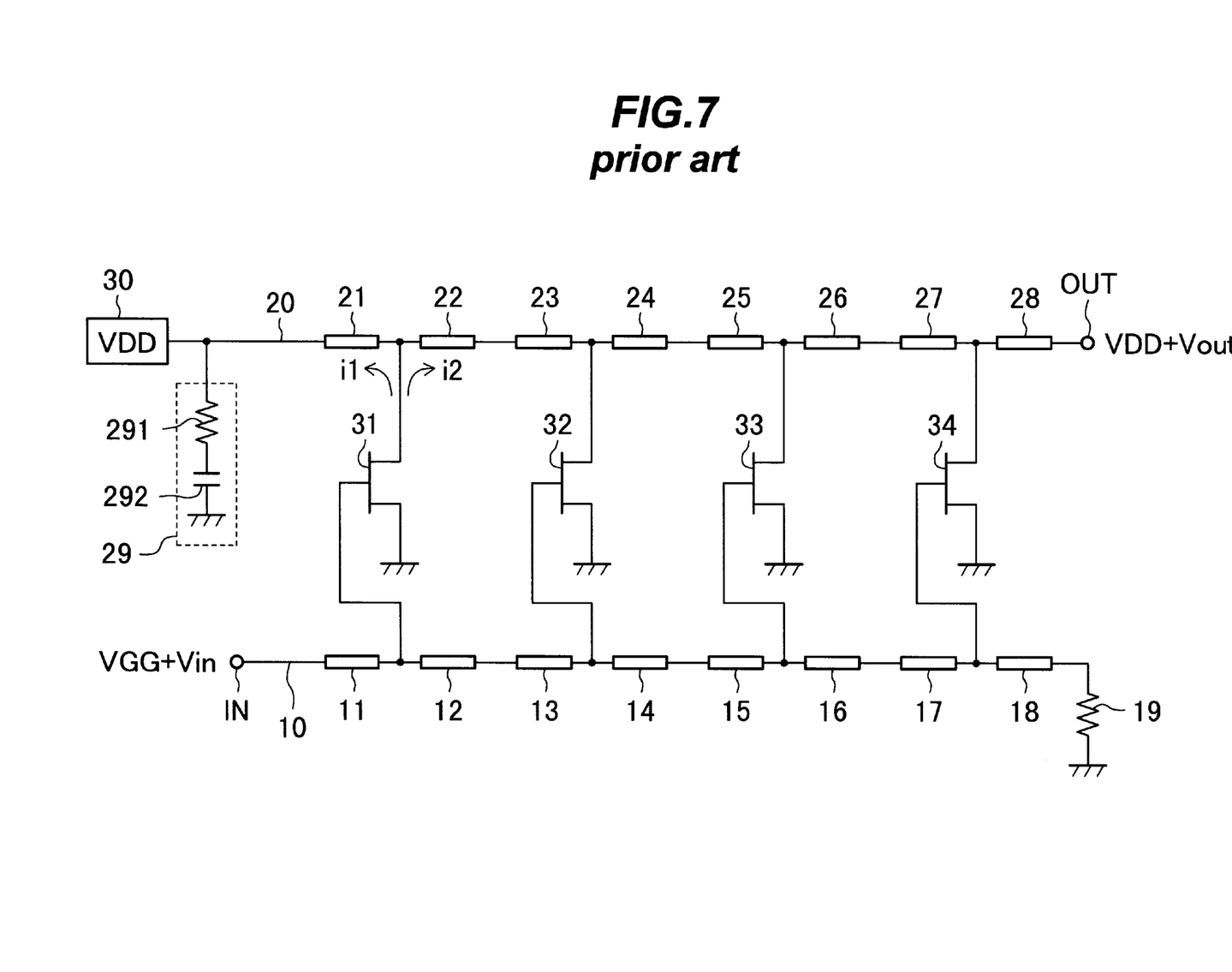
FIG. 7 is a circuit diagram showing a prior art typical distributed amplifier.

FIG. 7 shows a prior art typical distributed amplifier.

A terminating circuit 29 of an output transmission line 20 having elements 21 to 28 consists of a terminating resistor 291 almost equal to the characteristic impedance of the transmission line 20 and a capacitor 292 for AC grounding, serially connected to each other. The capacitor 292 can reduce power consumption caused by applying a drain bias voltage VDD to the resistor 291 if the capacitor 292 is not connected.

An output voltage signal Vout=0 when an input voltage signal Vin=0. In this state, a DC gate bias voltage VGG and a DC drain bias voltage VDD are respectively applied to the gate and drain of each of FETs 31 to 34 to force a DC bias current to flow through each of the FETs 31 to 34.

When the input voltage signal Vin is superimposed on the bias voltage VGG, the signal Vin propagates along an input transmission line 10 and a part thereof is applied to the gates of FETs 31 to 34. In the FET 31 for example, a signal component (i1+i2)) is superimposed on the bias current, wherein i1 and i2 are currents flowing through the output transmission line 20 to the terminating circuit 29 and the output OUT, respectively. Currents flowing from the amplifying FETs 31 to 34 to the output OUT are simply summed at the output OUT since line lengths from the input IN to the output OUT through the respective FETs 31 to 34 are the same as each other and in turn the respective currents therefrom have the same phase at the output OUT.

In order to make a frequency characteristic of the gain wider in bandwidth, it is necessary to employ FETs 31 to 34 having smaller gate capacitances. However, as the gate capacitances are smaller, the gains of the FETs 31 to 34 become lower.

Figure 8:
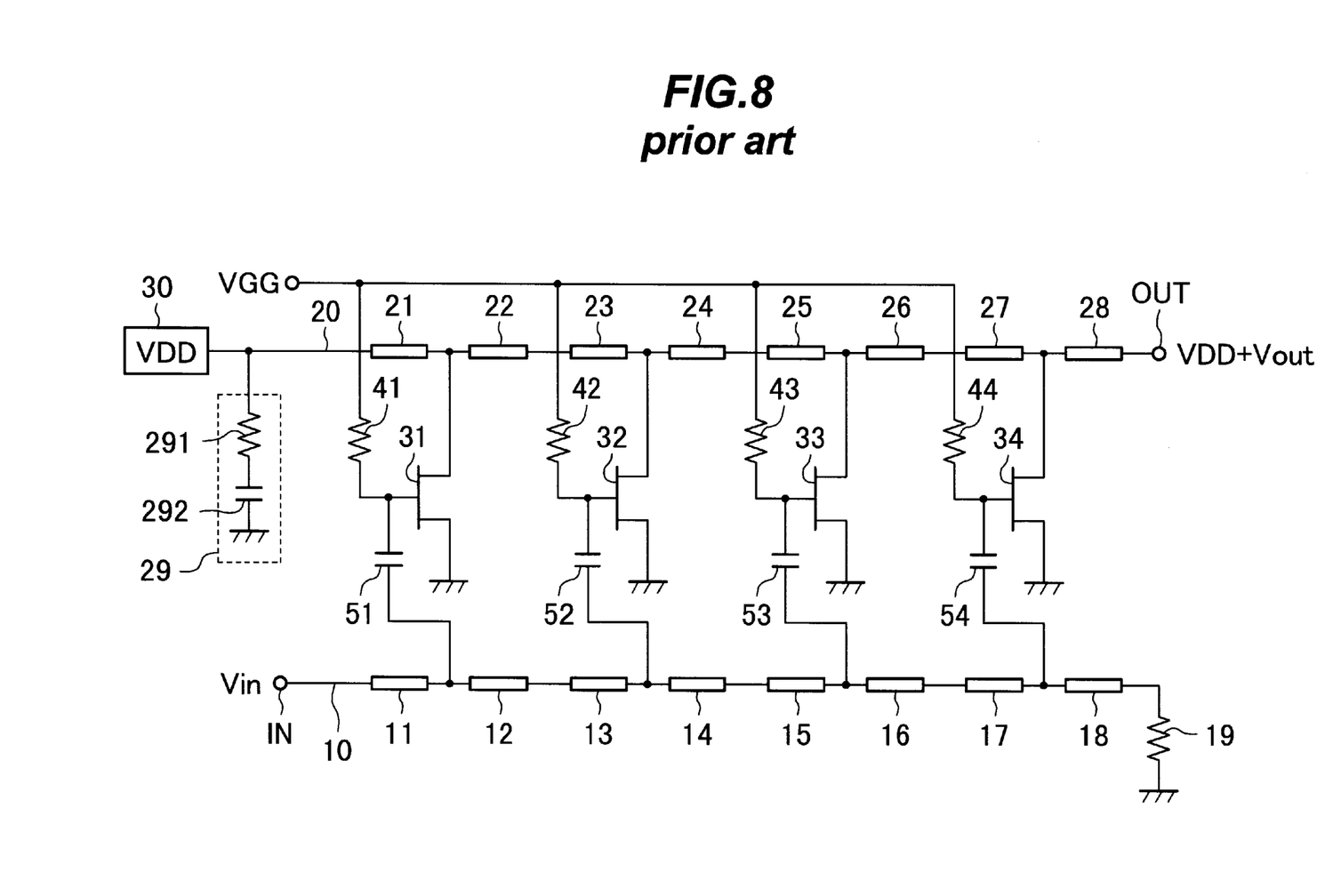
FIG. 8 is a circuit diagram showing another prior art distributed amplifier.

In order to solve this problem, employed is a distributed amplifier configured such that, as shown in FIG. 8, capacitors 51 to 54 are connected between the gates of respective FETs 31 to 34 and the input transmission line 10 and thereby, a combined capacitance of each gate capacitance and each capacitor is reduced. In this configuration, the gate bias voltage VGG is applied to the gates of FETs 31 to 34 through resistors 41 to 44, respectively.

Figure 4:
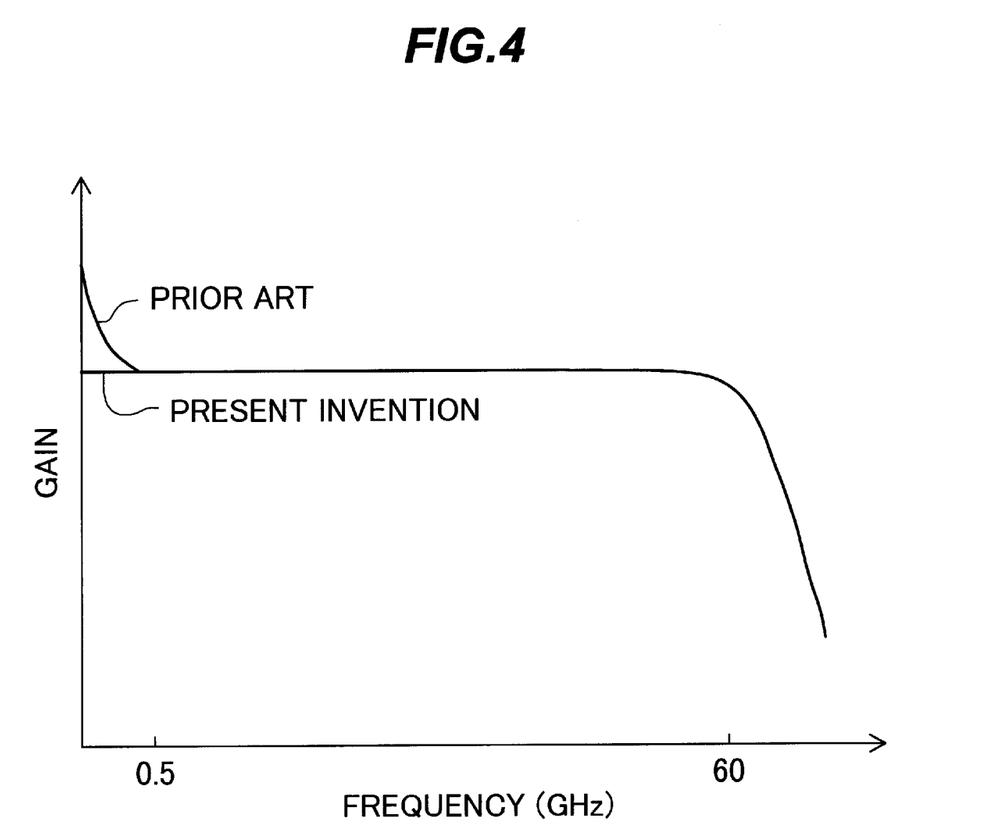
FIG. 4 is a graph showing frequency characteristics of gains of the distributed amplifiers of FIG. 1 and the prior art.

In both of the distributed amplifiers of FIGS. 7 and 8, since the impedance of the capacitor 292 can be neglected in regard to the high frequency components of the input voltage Vin, the impedances of the terminating circuit side and the output OUT side viewed from the drain of the FET 31 are almost equal to the characteristic impedance, leading to the relation of i1=i2. This applies to each case of the FETs 32 to 34 in similar manner. However, since the capacitance of the capacitor 292 cannot be neglected in regard to the low frequency components of the input voltage signal Vin, the relation of i1<i2 holds. This again applies to each case of the FETs 32 to 34 in similar manner. For this reason, as shown in FIG. 4, the gain of the distributed amplifier in a low frequency band is higher than that in a high frequency band where the gain stays flat, and it tends to increase as the frequency is lower in the low frequency band.

If the capacitance 292 is omitted in order to prevent the increase in the gain in the low frequency band, power consumed in the distributed amplifier is increased by the drain bias voltage VDD applied to the resistor 291.

SUMMARY OF THE INVENTION

Accordingly, it is an object of the present invention to provide a distributed amplifier capable of improving a flatness of its gain over a low frequency band in a case where a capacitor for ac-grounding is employed in a terminating circuit of an output transmission line.

In one aspect of the present invention, there is provided a distributed amplifier comprising a plurality of series-connected circuits, provided for respective amplifying transistor, each including a capacitor and a resistor connected in series to each other between the control input of the corresponding transistor and a reference potential, each having impedance lower than the input impedance of the transistor in a frequency band lower than a frequency, but higher than this input impedance in a frequency band higher than this frequency.

A current flowing through each series-connected circuit can be neglected in the high frequency band, but cannot be neglected in the low frequency band. As a frequency is lower, an input signal to the transistor decreases and the output signal thereof decreases in the low frequency band.

On the other hand, as a frequency is lower, the impedance of a terminating circuit including a capacitor and a resistor connected in series increases in the low frequency band, thereby a current signal flowing to the output side of an output transmission line from the transistor is larger than a current signal flowing to the terminating circuit located at the opposite side thereof.

Hence, the amplitude of the current signal flowing to the output side can be flattened in magnitude over the low frequency band. That is, the flatness of the gain over the low frequency band can be improved.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

It should be noted that the use of the terms "connected" and "coupled" indicates an electrical connection between two elements and can include an intervening element between the two "coupled" or "connected" elements.

First Embodiment

Figure 1:
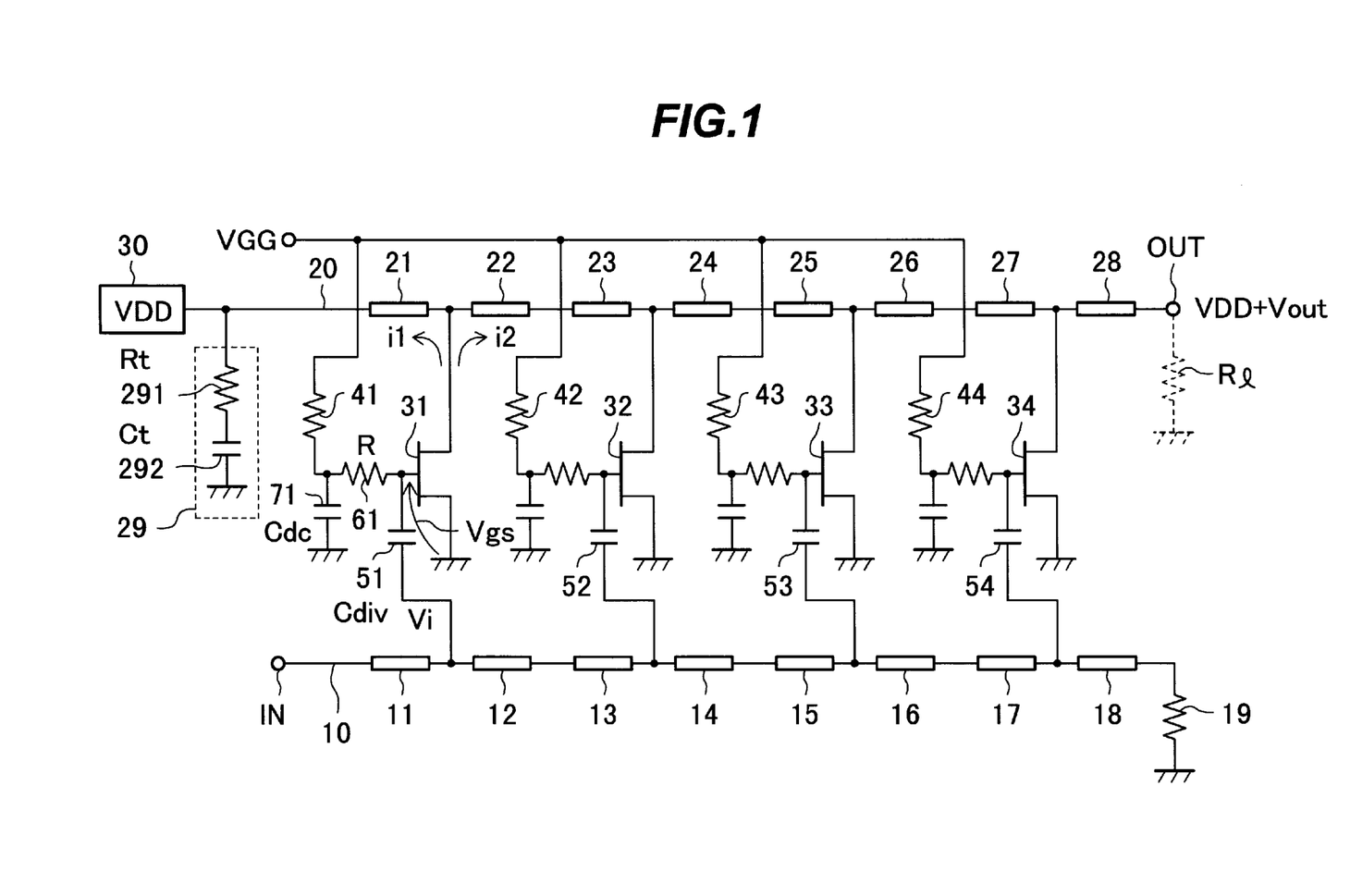
FIG. 1 is a circuit diagram showing a distributed amplifier of a first embodiment according to the present invention.

FIG. 1 shows a distributed amplifier of a first embodiment according to the present invention. This circuit is included in a semiconductor integrated circuit, for example, a monolithic microwave integrated circuit, and an improvement is made to the circuit of FIG. 8 in flatness of its gain over a low frequency band.

Elements 11 to 18 of an input transmission line 10 and elements 21 to 28 of an output transmission line 20 are both inductors or portions of transmission lines. The gate capacitances of transistors 31 to 34 and capacitors 51 to 54 are coupled to the input transmission line 10 to constitute a pseudo input transmission line having a characteristic impedance of substantially 50Ω, while the capacitances between the drains and sources of the transistors 31 to 34 are coupled to the output transmission line 20 to constitute a pseudo output transmission line having a characteristic impedance of substantially 50Ω.

Between the transmission lines 10 and 20, the FETs 31 to 34 are coupled as amplifier elements. That is, for each i of 1 to 4, the source and drain of FET $3i$ are connected to the transmission line 20 and ground, respectively, the gate of FET $3i$ is connected through the capacitor $5i$ to the transmission line 20, and the bias voltage VGG is applied to the gate of FET $3i$ through series-connected resistors $4i$ and $6i$.

MESFETs are employed as FETs 31 to 34 in order to make a frequency band wider.

An input voltage signal Vin is applied to the input terminal IN which is one end of the input transmission line 10. The other end of the input transmission 10 is grounded through a terminating resistor 19. One end of the output transmission line 20 is grounded through a termination circuit 29 and is also connected to a circuit 30 for generating the drain bias voltage VDD. The circuit 30 has large impedance for a signal.

The terminating circuit 29 consists of a terminating resistor 291 having an impedance almost equal to the characteristic impedance of the pseudo output transmission line and a capacitor for AC grounding, connected to the resistor 291 in series. A voltage (VDD+Vout) is taken out from the output terminal OUT which is the other end of the output transmission line 20.

The circuit of FIG. 1 differs from that of FIG. 8 in that a resistor 61 and a capacitor 71 are connected in series between the gate of FET 31 and ground and this applies to the other FETs in a similar manner.

Figure 2:
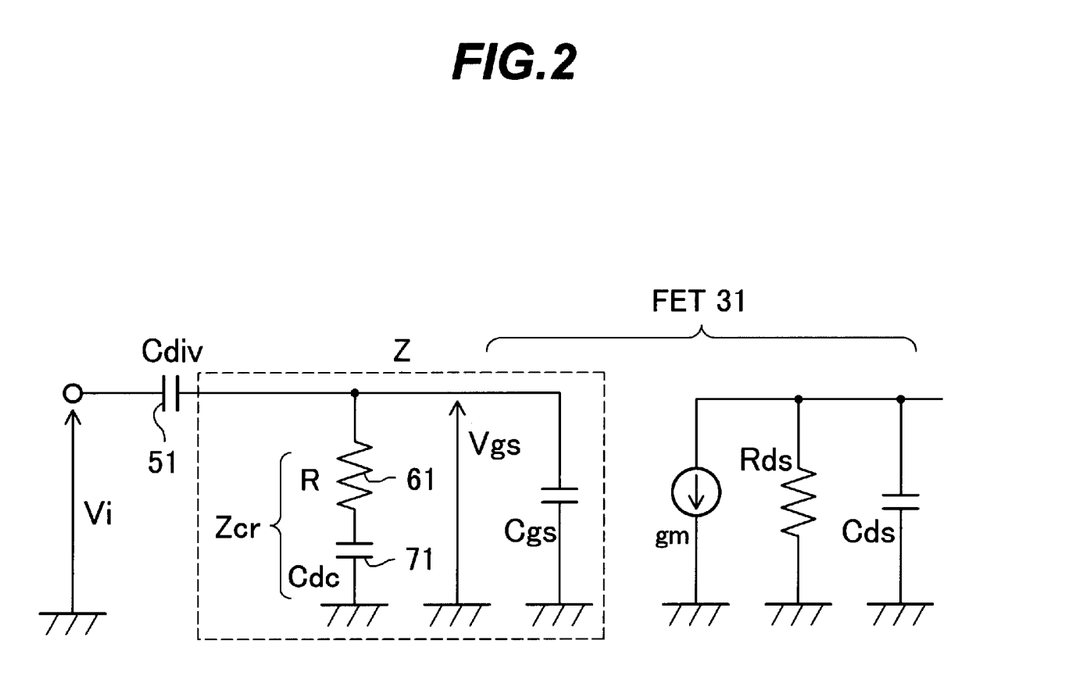
FIG. 2 is a diagram of an equivalent circuit having the FET 31 and its gate side periphery of FIG. 1.

FIG. 2 shows an equivalent circuit having the FET 31 and its gate side periphery of FIG. 1.

In FIG. 2, Cgs, gm, Rds and Cds indicate a gate to source capacitance, a mutual conductance, a drain to source resistance and a drain to source capacitance of the FET 31, respectively, wherein a gate to drain capacitance of the FET 31 is omitted in FIG. 2 on the assumption that the capacitance is negligibly small in comparison with Cgs.

The combined impedance Z of a parallel circuit constructed of the capacitance Cgs of the FET 31 and the series-connected circuit having the resistor 61 and the capacitor 71 is expressed by the following formula:

$$Z = Zgs \cdot Zcr/(Zgs+Zcr) \qquad (1),$$

where Zgs is the impedance between the gate and source of the FET 31 and Zcr is the impedance of the series-connected circuit. Letting j be an imaginary unit, ω an angular frequency, and Cdc the capacitance of the capacitor 71, the Zgs and Zcr are respectively expressed by the following formulae:

$$Zgs = 1/(j\omega Cgs) \qquad (2),$$

$$Zcr = R + 1/(j\omega Cdc) \qquad (3).$$

A voltage Vgs between the gate and source of FET 31 when a voltage signal Vi is applied to the input side electrode of the capacitor 51 is expressed by the following formula:

$$Vgs = Vi \cdot Z/(Z + 1/(j\omega Cdiv)) = Vi/(1 + 1/(j\omega Cdiv Z)) \qquad (4),$$

where Cdiv is a capacitance of the capacitor 51.

The impedance Zcr is determined so as to be lower in a low frequency band but higher in a high frequency band, in comparison with the impedance Zgs. That is, the design parameters R and Cdc of the series-connected circuit are determined such that in the low frequency band, the following formula holds:

$$|R+1/(j\omega Cdc)| < 1/\omega Cgs \therefore |j\omega CgsR + Cgs/Cdc| < 1 \qquad (5),$$

and in the high frequency band, the following formula holds:

$$|j\omega CgsR + Cgs/Cdc| > 1 \qquad (6).$$

(A) According to the above relations, the current flowing through the series-connected circuit can be neglected in the high frequency band but cannot be neglected in the low frequency band, and as a frequency is lower, the current flowing between the gate and source of the FET 31 decreases and the voltage signal amplitude |Vgs| between the gate and source of the FET 31 is lower. That is, in the formula (4), as ω decreases, $|1/(j\omega Cdiv Z)|$ is larger and |Vgs| is smaller. For this reason, the amplitude of the drain current signal (i1+i2) of the FET 31 is smaller as a frequency is lower.

Figure 3:
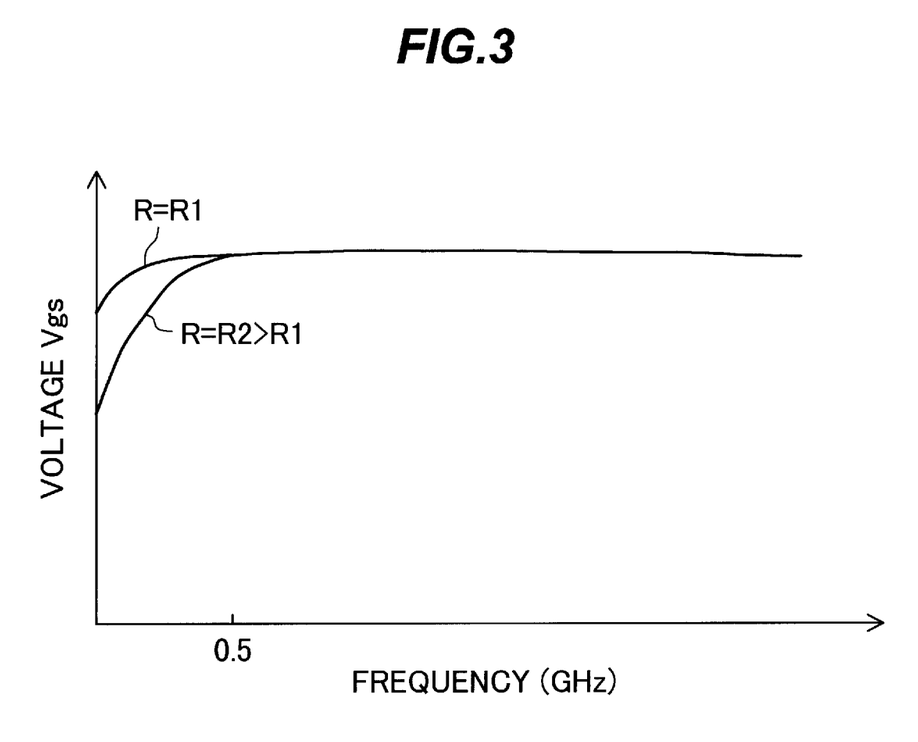
FIG. 3 is a graph showing a frequency characteristic of the voltage Vgs between the gate and the source of this FET.

FIG. 3 shows a frequency characteristic of the voltage Vgs, wherein the voltage Vgs decreases in the low frequency band and this trend is stressed as the resistance value R of the resistor 61 increases.

(B) On the other hand, since the terminating circuit 29 has a capacitor 292 connected in series to the terminating resistor 291, as a frequency is lower in the row frequency band, the impedance Zt of the terminating circuit 29 increases. Hence, in regard to the drain current signal (i1+i2) of the FET 31, the current signal i2 flowing to the output OUT side is larger than the current signal i1 flowing to the terminating circuit 29 from the drain of the FET 31.

That is, as a frequency is lower, the absolute value of a following i2/(i1+i2) is larger:

$$i2/(i1+i2) = Zt/(Zt+R1) = 1/(1+(R1/Zt))$$

, where R1 is a load resistance connected to the output OUT and is almost equal to the characteristic impedance of the pseudo output transmission line. Letting RI and Ct be the resistance of the terminating resistor 291 and the capacitance of the capacitor 292, respectively, the impedance Zt of the terminating circuit 29 is expressed by the following formula:

$$Zt = Rt + 1/(j\omega Ct).$$

Rt is set so as to be almost equal to the characteristic impedance of the pseudo output transmission line.

In view of the above described (A) and (B), by properly determining the design parameters, the amplitude of the current i2 can be almost constant over the low frequency band. This applies to FETs 32 to 34 in a similar manner.

Hence, the gain of the distributed amplifier G=10log (Vout/Vi)=10log(4·i2·RI/Vi) can be almost flat over the low frequency band as well.

FIG. 4 shows the gain of the distributed amplifier wherein the flatness thereof is improved over the low frequency band lower than 500 MHz by such relations and a sufficient flatness is achieved over a wide frequency band lower than 60 GHz.

Second Embodiment

Figure 5:
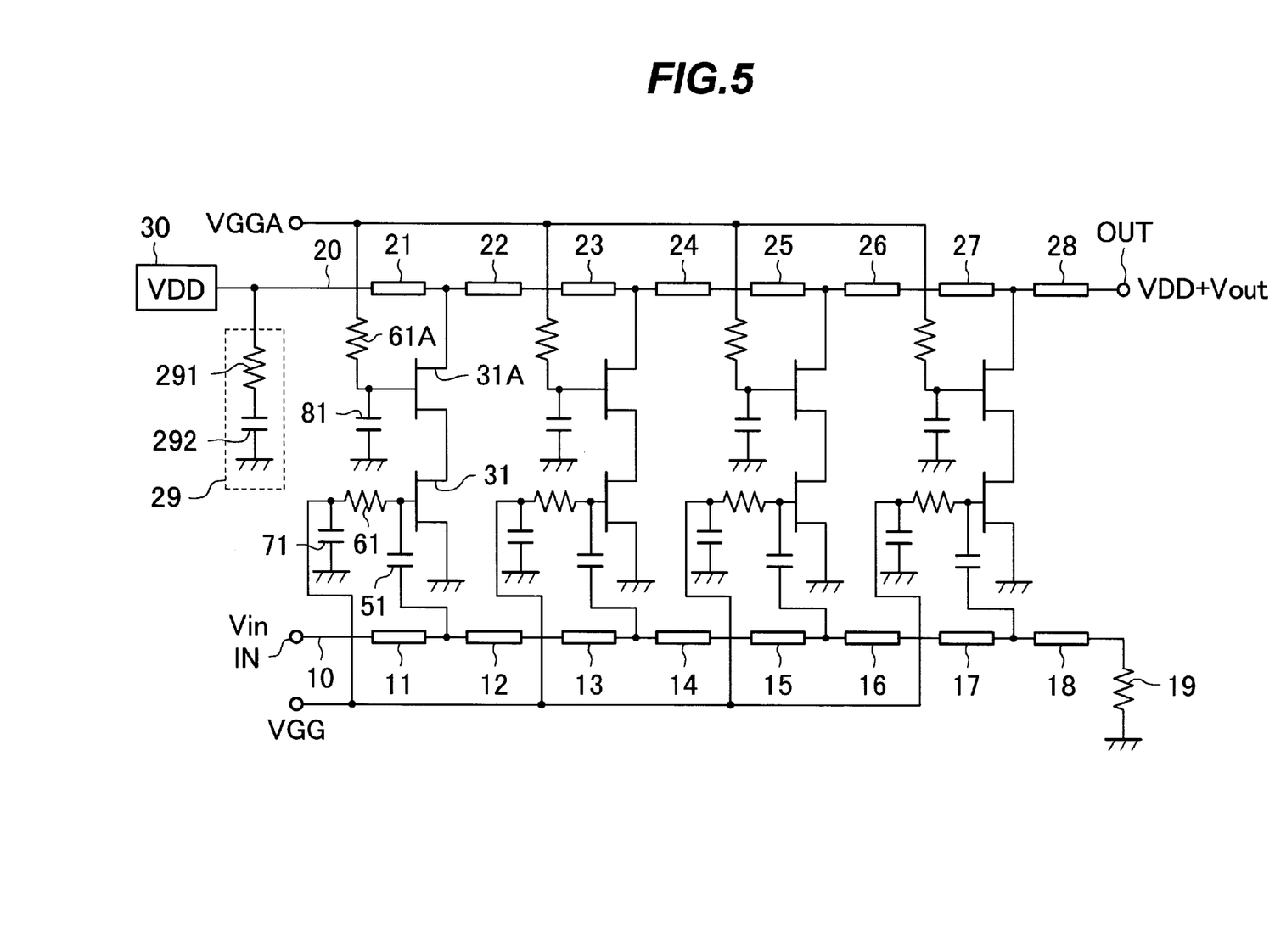
FIG. 5 is a circuit diagram showing a distributed amplifier of a second embodiment according to the present invention.

FIG. 5 shows a distributed amplifier of a second embodiment according to the present invention.

In this circuit, an FET 31A is connected between the drain of the FET 31 and the output transmission line 20. That is, the FETs 31 and 31A are cascoded. The gate of the FET 31A is ac-grounded through a capacitor 81, and further the gate thereof is applied with a gate bias voltage VGGA through a resistor 61A. This holds in other amplifier stages in a similar manner.

As well known to those skilled in the art, the Miller effect is suppressed by such cascode connection, thus increasing a frequency range over which the gain is flat.

The effect by the series-connected circuit constructed of the resistor 61 and the capacitor 71 is similar to that of the first embodiment.

Third Embodiment

Figure 6:
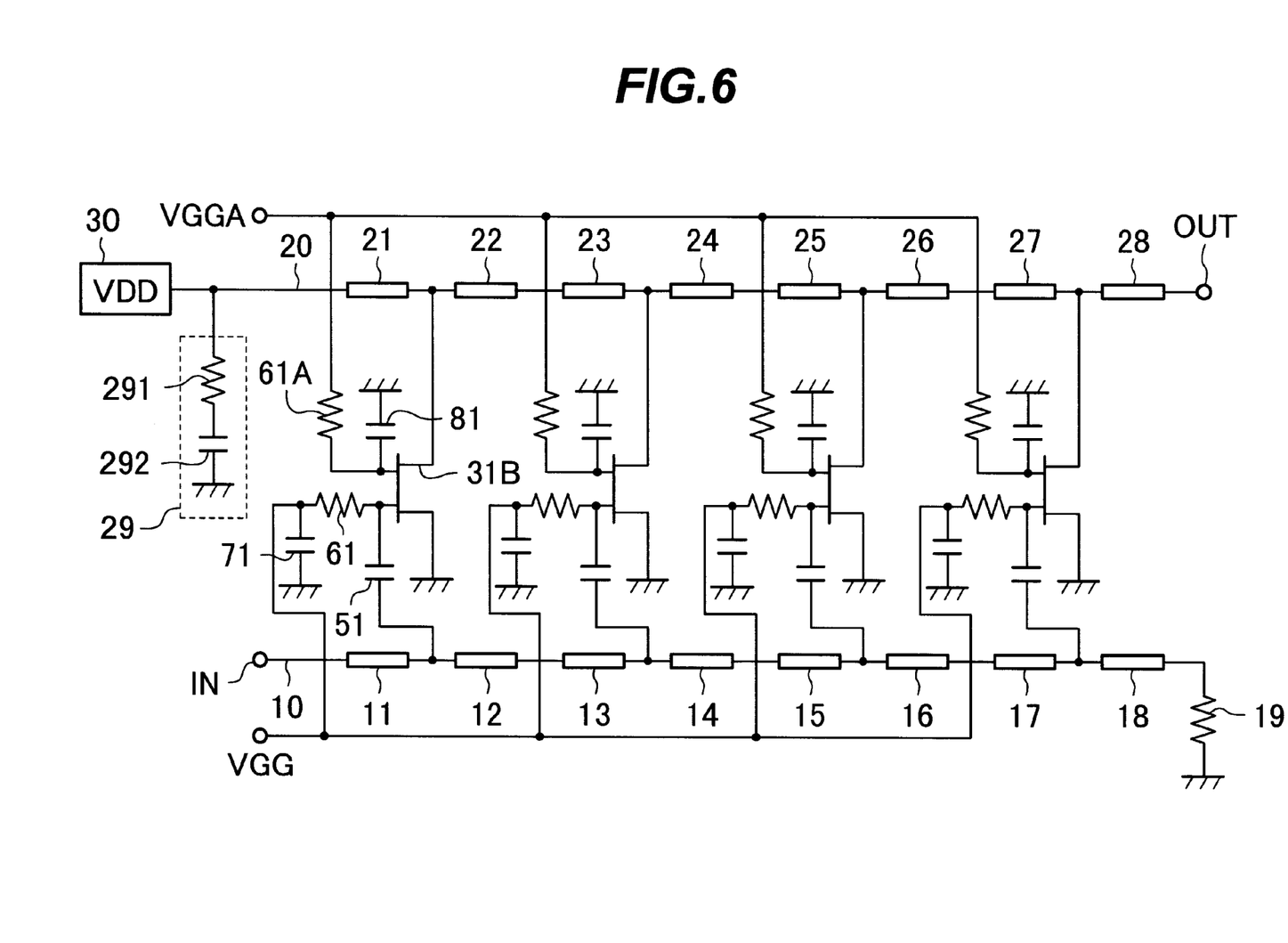
FIG. 6 is a circuit diagram showing a distributed amplifier of a third embodiment according to the present invention.

FIG. 6 shows a distributed amplifier of a third embodiment according to the present invention.

In this circuit, a dual gate FET 31B is employed instead of the cascoded FETs 31A and 31. This holds in the other amplifier stages in a similar manner. Operation of such a circuit is similar to that of FIG. 5.

Although preferred embodiments of the present invention has been described, it is to be understood that the invention is not limited thereto and that various changes and modifications may be made without departing from the spirit and scope of the invention.

For example, the number of amplifier circuits connected between the input transmission line 10 and the output transmission line 20 is not limited to 4, but has only to be 2 or more.

Further, a kind of transistor as an amplifier circuit element is selected according to operating frequencies and not limited to a MES (Metal Semiconductor) structure, but may be a MIS (Metal Insulator Semiconductor) structure or a bipolar type. In the case of the MES structure, a transistor may be HEMT (High Electron Mobility Transistor) and in the case of the bipolar type, a transistor may be HBT (Hetero Bipolar Transistor).

What is claimed is:

1. A distributed amplifier comprising:
   an input transmission line;
   an output transmission line;
   a terminating circuit, connected to said output transmission line, including a first capacitance and a first resistor connected in series to each other;
   a plurality of amplifier circuits connected between said input and output transmission lines, each amplifier circuit including a transistor for amplification, said transistor having a control input coupled to said input transmission line; and
   a plurality of series-connected circuits, provided for respective said amplifier circuits, each including a second capacitor and a second resistor connected in series to each other between said control input of said corresponding transistor and a reference potential, each having impedance lower than an input impedance of said transistor in a frequency band lower than a frequency, but higher than said input impedance in a frequency band higher than said frequency.

2. The distributed amplifier of claim 1, wherein a bias voltage is applied to said control inputs of said transistors through respective said second resistors.

3. The distributed amplifier of claim 2, wherein each of said transistors is a field effect transistor having a gate electrode as said control input, a drain electrode coupled to said output transmission line, and a source electrode applied with said reference potential.

4. The distributed amplifier of claim 3, wherein each of said amplifier circuits further comprises a transistor cascoded to said corresponding transistor and connected between this transistor and said output transmission line.

5. The distributed amplifier of claim 3, wherein each of said field effect transistors has a dual gate.

6. The distributed amplifier of claim 1, wherein each of said transistors is a field effect transistor having a gate electrode as said control input, a drain electrode coupled to said output transmission line, and a source electrode applied with said reference potential.

7. The distributed amplifier of claim 6, wherein each of said amplifier circuits further comprises a transistor cascoded to said corresponding transistor and connected between this transistor and said output transmission line.

8. The distributed amplifier of claim 6, wherein each of said field effect transistors has a dual gate.

9. A semiconductor integrated circuit comprising:
   an input transmission line;
   an output transmission line;
   a terminating circuit, connected to said output transmission line, including a first capacitance and a first resistor connected in series to each other;
   a plurality of amplifier circuits connected between said input and output transmission lines, each amplifier circuit including a transistor for amplification, said transistor having a control input coupled to said input transmission line; and
   a plurality of series-connected circuits, provided for respective said amplifier circuits, each including a second capacitor and a second resistor connected in series to each other between said control input of said corresponding transistor and a reference potential, each having impedance lower than an input impedance of said transistor in a frequency band lower than a frequency, but higher than said input impedance in a frequency band higher than said frequency.

10. The semiconductor integrated circuit of claim 9, wherein said semiconductor integrated circuit is a monolithic microwave integrated circuit.

* * * * *